United States Patent [19]

Cohn

[11] 4,056,784
[45] Nov. 1, 1977

[54] SUPPRESSION OF PARAMETRIC OSCILLATIONS IN IMPATT AMPLIFIERS AND OSCILLATORS

[75] Inventor: Marvin Cohn, Baltimore, Md.

[73] Assignee: Westinghouse Electric Corporation, Pittsburgh, Pa.

[21] Appl. No.: 738,811

[22] Filed: Nov. 4, 1976

[51] Int. Cl.$^2$ .............................................. H03F 3/10
[52] U.S. Cl. .................................. 330/287; 307/88.3; 331/107 R; 330/4.5; 330/53
[58] Field of Search ..................... 330/4.5, 4.6, 34, 53, 330/56; 331/107 R; 307/88.3

[56] References Cited

U.S. PATENT DOCUMENTS 4,013,974  3/1977  Quine ...................................... 330/34

Primary Examiner—Rudolph V. Rolinec
Assistant Examiner—Darwin R. Hostetter
Attorney, Agent, or Firm—H. W. Patterson

[57] ABSTRACT

A balanced circuit for IMPATT amplifiers and oscillators, which includes at least one pair of anti-series connected matched avalanche diodes electrically connected to the junction of a balanced and an unbalanced transmission line is disclosed. The diodes which are pumped by a large-signal input, are d-c biased to operate in the avalanche condition. A parametrically generated pair of unwanted idler frequencies are separated so that one component of the parametric-pair flows in the balanced line, and the other component flows in the unbalanced line. A central branch of the unbalanced line portion is resistively loaded to overcome the parametrically induced negative resistance of the diodes operating in the avalanche condition, and to suppress all incipient unwanted parametrically generated frequencies. The resistance loading, which is frequency independent, has little effect on the impedance presented to the diodes at the large-signal frequency.

12 Claims, 7 Drawing Figures

SUPPRESSION OF PARAMETRIC OSCILLATIONS IN IMPATT AMPLIFIERS AND OSCILLATORS

BACKGROUND OF THE INVENTION

The present invention relates to IMPATT amplifiers and oscillators, and more particularly to a circuit for suppressing undesirable parametric oscillations capable of being generated in such amplifiers and oscillators.

In parametric amplifiers and oscillators, the parametric effects, under controlled conditions, provide amplification and frequency conversion. IMPATT amplifiers and oscillators, however, employ semiconductors which exhibit nonlinear reactance and parametrically generated negative resistance under large-signal conditions; these effects are usually undesirable since they cause spurious oscillations leading to severe distortions of the output signal, a reduction of power output and efficiency, and an increase in noise output.

In recent years, there have been significant improvements in avalanche diodes to realize the full high power capability of IMPATT devices operating at high frequency. Among the improvements has been the reduced series resistance of, for example, the gallium arsenide (GaAs) avalanche diodes having a Read Structure which has yielded more than 5 watts cw at greater than 30% efficiency when operated as an IMPATT oscillator. However, the limitation to the application of this diode to its operation in an IMPATT amplifier or oscillator circuit has been its inherent nonlinear reactance. When the reactance is varied at large-signal frequencies, identified as $f_s$, unwanted negative-resistance is parametrically generated. Because of the reduced series resistance of the improved diode, the magnitude of the parametrically generated negative-resistance can readily exceed its series resistance; consequently, this nonlinear, negative-resistance diode is vulnerable to unwanted parametric oscillations induced when pumped by $f_s$. This results in severe distortions in its output signal and a reduction of its power output and efficiency.

When the nonlinear, negative-resistance diodes had a higher inherent series resistance, there was little problem from parametrically induced idler frequencies; however, the IMPATT oscillators and amplifiers incorporating these higher resistance diodes had inherently low power output capability and efficiency. With the advent of the newer diodes where the series resistance was lower than the parametrically generated negative resistance, circuit elements have had to be added to the signal input circuit to overcome the negative-resistance which had to have negligible effect on the large-signal input to be amplified, $f_s$, and, at the same time, would represent positive-resistance loading at the frequencies of the parametrically induced idler frequencies, $f_1$ and $f_2$. This has been difficult to achieve, and as a result, the IMPATT oscillators and amplifiers have been operated at reduced power in order to reduce the distortion of the output signal and, consequently, are operated at a reduced efficiency.

Suppression of unwanted parametric oscillations in oscillators and amplifiers containing IMPATT diodes is necessary in order to eliminate severe distortions in the output signals. These parametric oscillations are generated in IMPATT diodes as in other semiconductor devices that exhibit nonlinear reactance behavior under large-signal conditions. This behavior depends on the extent to which the device is being pumped or driven into its nonlinear reactance range by the large-signal input, identified as $f_s$, as well as on circuit conditions. One commonly observed nonlinearity is the saturation of the output signal by $f_s$ due to the combined effects of the widening of the avalanche zone of the semiconductor, space charge effects and nonsaturated drift velocities. Another nonlinear effect is spurious parametric oscillations due to a negative conductance created by modulation of ionization rates in the semiconductor by the electric field across the semiconductor. These must be suppressed for high efficiency operation. The cause of these spurious oscillations is the time-varying inductance produced by the variation of the semiconductors' ionization rates.

As is well known to those skilled in the art, the relationships between the pumping signal frequency $f_s$ and the spurious oscillation frequencies $f_1$ and $f_2$, commonly referred to as a parametric-pair of idler frequencies, can be derived from the Manley-Rowe equations. For any single valued, lossless, nonlinear reactance in a system which is excited so that the current and voltage have frequency components of the form $mf_2 + nf_3$, where $m$ and $n$ are integers:

$$\sum_{m=0}^{\infty} \sum_{n=-\infty}^{\infty} \frac{m p_{m,n}}{mf_2 + nf_3} = 0 \tag{1}$$

$$\sum_{n=0}^{\infty} \sum_{m=-\infty}^{\infty} \frac{n p_{m,n}}{mf_2 + nf_3} = 0 \tag{2}$$

where $P_{m,n}$ is the average power flowing into the reactance at the frequencies $\pm (mf_2 + mf_3)$. Let us assume the existence of a parametric pair at the frequencies $f_1$ and $f_2$ caused by the pumping signal at $f_3$; that is, $$f_3 = f_1 + f_2$$

or $$f_1 = f_3 - f_2$$

where $f_1$ and $f_2$ are the parametric-pair of idler frequencies and $f_3$ is the pumping or driving signal $f_s$. In regard to the relationships between the average powers flowing into the reactances at the pumping and idler frequencies, we can derive the following set of equations for this system:

$$\frac{P_1}{f_1} - \frac{P_2}{f_2} = 0 \tag{3}$$

$$\frac{P_s}{f_s} + \frac{P_2}{f_2} = 0 \tag{4}$$

Among the conclusions which may be drawn from equations (3) and (4) applicable to this system are:

a. The presence of a pumping source at large-signal frequency $f_s$ requires, according to our sign convention, positive $P_s$ and, consequently, negative $P_2$ and $P_1$. The circuit can, therefore, deliver power at $f_2$ and $f_1$, the idler frequencies.

b. If $f_1$ can be prevented from delivering power, then $f_2$ will also not deliver power; thus, if $f_1$ is suppressed, then $f_2$ will be simultaneously suppressed.

SUMMARY OF THE INVENTION

Briefly, the present invention is a balanced circuit for IMPATT apparatus, namely amplifiers and oscillators which include nonlinear, negative-resistance semiconductors that suppress unwanted parametrically-induced frequencies in order to achieve high power output and high-efficiency of operation.

In one aspect, a pair of nonlinear, negative resistance matched diodes in an anti-series arrangement is electrically connected to the junction of a balanced and an unbalanced transmission line of an IMPATT amplifier. The diodes are pumped by a large-signal input and are d-c biased at their common terminal to operate in an avalanche condition. The central branch of the unbalanced line, which is also connected to the common terminal, is resistively loaded to overcome the parametrically-induced negative-resistance of the diodes. The resistive loading is frequency independent. D-c bias power dissipation is avoided by providing a shunt inductance across the resistive load as a bypass for the d-c current. The balanced transmission line is a two-conductor line; and thus may include, but not be limited to, a waveguide or a slot line. The unbalanced transmission line is a three-conductor line and thus may include, but not be limited to, a coaxial line, a coplanar line, or a microstrip line.

In accordance with the operation of the present invention, the large-signal input of frequency $f_s$ is introduced into the balanced transmission line and is amplified by the diodes operating in the avalanche condition. The large-signal pumping of the nonlinear inductive reactance of the diodes at the frequency $f_s$ parametrically generates an unwanted negative-resistance and an unwanted parametric-pair of idler frequencies $f_1$ and $f_2$ whose sum is equal to $f_s$; $f_1$ and $f_2$ flow in separate paths; i.e., $f_1$ flows in the balanced line path and $f_2$ flows in the unbalanced line path, where the diode pair is common to both paths. By resistively loading the central branch of the unbalanced line sufficiently to overcome the parametrically generated negative-resistance, the idler component flowing in the unbalanced path is suppressed, and, simultaneously suppresses the other idler component flowing in the balanced path. The even order intermodulation products due to the simultaneous input of more than one large-signal are constrained to the unbalanced line and prevented from flowing in the balanced line.

Although the present invention is disclosed in connection with an IMPATT amplifier, it is equally applicable to an IMPATT oscillator; the term IMPATT apparatus is meant to include either an IMPATT amplifier or an oscillator.

Figure 1:
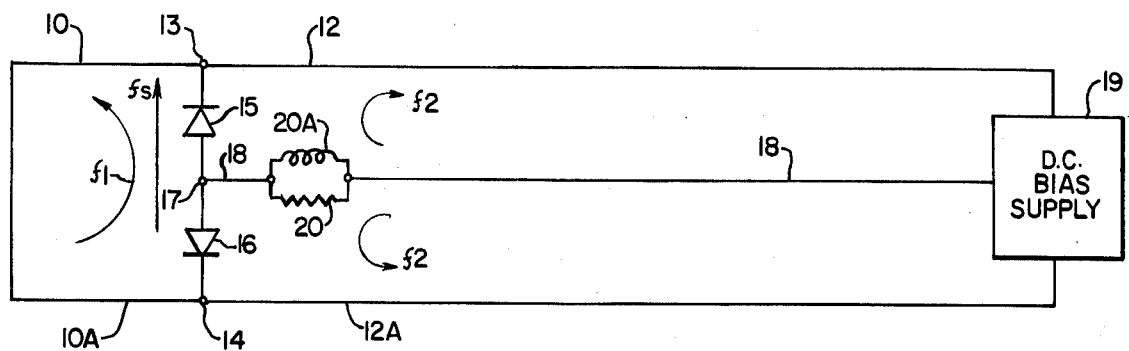
FIG. 1 is a schematic diagram of an IMPATT amplifier in accordance with one embodiment of the invention.

Referring to FIG. 1, a high-frequency, large-signal input of frequency $f_s$ is propagated along a balanced transmission line 10 and 10A to its junction with the outer conductors 12 and 12A of the unbalanced transmission line and the cathode terminals 13 and 14 of at least one pair of matched nonlinear, negative-resistance diodes 15 and 16. Diodes 15 and 16 thus being connected in an anti-series arrangement, these diodes may also, alternatively, be connected so as to have a cathode-to-cathode common terminal and the respective anodes connected to the junction of the balanced and the unbalanced transmission lines. A common terminal 17 is interconnected with a central branch 18 of the unbalanced transmission line. A constant current d-c bias supply 19 is connected in parallel across the unbalanced transmission line conductors 12 and 18 and 12A to 18 to cause diodes 15 and 16, respectively, to operate in the avalanche condition. As is well known to those skilled in the art, the pumping action of the large-signal frequency $f_s$ on the nonlinear inductive reactance of the diodes 15 and 16, operating in the avalanche condition, will generate an unwanted parametrically-induced negative resistance in diodes 15 and 16 and unwanted parametric oscillation, commonly referred to as idler frequencies, in the balanced and unbalanced transmission line circuits. Resistor 20 is the resistance loading in the central branch 18 to overcome the unwanted parametrically-induced negative resistance in diodes 15 and 16. Shunt inductance 20A, having an impedance much greater than resistor 20 at the lowest anticipated idler frequency, and appearing as an open circuit at high frequencies, shunts the d-c power from bypass resistor 20, thus practically eliminating the d-c power dissipation through resistor 20.

Figure 2:
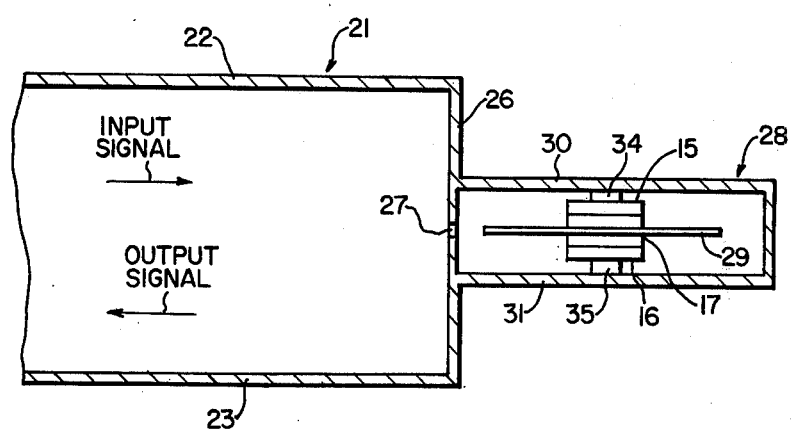
FIG. 2 is a fragmentary, sectional side view of a pictorial representation of one embodiment of an IMPATT amplifier constructed in accordance with one embodiment of the present invention.
Figure 3:
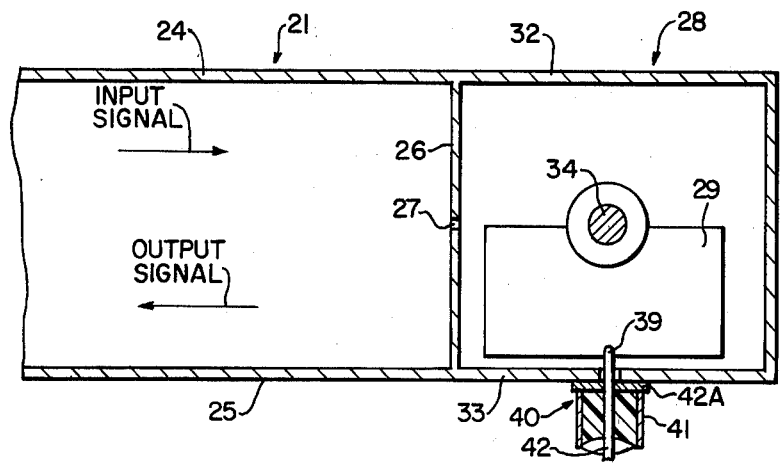
FIG. 3 is a fragmentary, sectional top view of the pictorial representation of FIG. 2.

Referring to FIGS. 2 and 3 which show a cutaway side and top or plan view (not to scale) of a waveguide enbodiment of an IMPATT amplifier to illustrate the mounting and arrangement of the diodes 15 and 16 includes a larger area portion 21 having opposing walls 22 and 23 (FIG. 2) and walls 24 and 25 (FIG. 3). Connected to the walls 22, 23, 24 and 25 at the extreme lefthand end of the waveguide portion 21 is a conventional circulator (not shown) to separate the input and the output signals. The large area portion 21 is enclosed at its righthand end as viewed in FIG. 3 by a wall 26 which has an opening or adjustable iris 27 centrally thereof. A smaller area portion 28 which is formed by opposing wall portions 30 and 31 (FIG. 2) and opposing wall portions 32 and 33 (FIG. 3) is connected at one end to the wall or plate 26 with the iris 27 providing communication between the portions 21 and 28 of the waveguide for transfer of electromagnetic energy.

In the narrow portion 28 as viewed in FIG. 2 are the pair of diodes 15 and 16 (FIG. 1) which are mounted in anti-series arrangement on electrically conductive studs 34 and 35, respectively, which are in electrical contact with the waveguide wall portions 30 and 31. The common terminal 17 of diodes 15 and 16 is in electrical contact with an electrical conductor 29. The height of the waveguide portion 28 is illustrated as being reduced from that of waveguide portion 21 to physically accommodate the mounting of the diodes 15 and 16 on their respective studs 34 and 35. The dimensions of the waveguide portion 28 cavity are optimized to provide for shunt resonance of the diodes 15 and 16 when mounted on their respective studs 34 and 35; and, in addition, to provide for a relatively high quality of resonance, or high Q, in the waveguide 28 cavity. The location of diodes 15 and 16 is approximately a quarter-wave from the iris 27 location and centered in the broad wall portions 30 and 31 of waveguide portion 28.

Referring to FIG. 3, the broad top wall portions 22 and 30 of waveguide portions 21 and 28 have been omitted to show a coaxial line 40. The coaxial line 40 has an outer conductor 41 which joins in electrical contact with the waveguide portion 28 by plate 42A. A coaxial line inner conductor 42, insulated from the waveguide portion 28, joins in electrical contact at point 39 with the electrical conductor 29, which in turn, is in electrical contact with the common terminal 18 (FIG. 1) of diodes 15 and 16. The conductor 29 can be an electrically conductive sheet which, with the waveguide broad walls 30 and 31, forms a short section of low impedance strip transmission line.

As already described, the resistive loading in the central branch of the unbalanced transmission line will overcome the unwanted parametrically induced negative-resistance in the pair of diodes. Simultaneously with the elimination of this unwanted negative-resistance, the unwanted parametrically generated frequency in the unbalanced line is suppressed, and, in accordance with the Manley-Rowe relationship, the unwanted parametrically-generated frequency in the balanced line will be suppressed.

Figure 4:
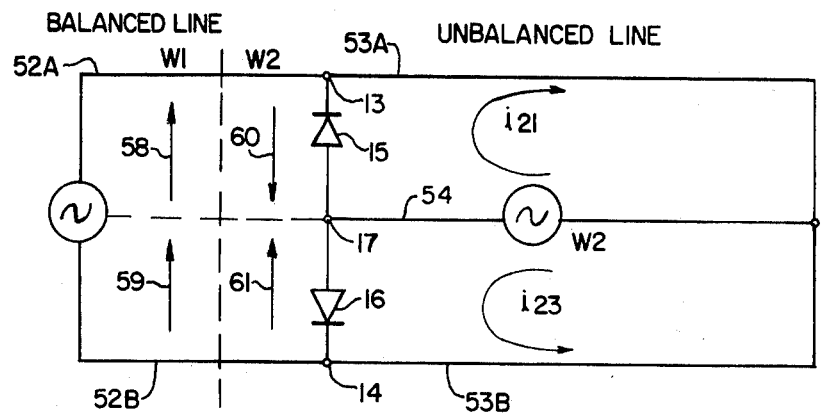
FIG. 4 is a schematic diagram to show an anti-series diode pair pumped at $\omega_s$ generating parametric-pair idler frequency components.

Referring to FIG. 4, the balanced circuit has the diodes 15 and 16 operating in the avalanche condition at high frequency and connected in an anti-series configuration located at the junction of a balanced transmission line 52A and 52B, and an unbalanced transmission line having two outer conductors 53A and 53B in parallel and a central branch 54 connected to the common terminal 17 of the diodes 15 and 16. The signal to be amplified is introduced at the balanced line 52A and 52B where it pumps the pair of diodes 15 and 16 with odd symmetry. The terms "even" and "odd" used here refer to electrical symmetry about node 2 at terminal 17.

As a further explanation, a balanced circuit is defined as having its circuit elements symmetrically disposed about a plane of symmetry. In this invention, the balanced circuit uses a matched pair of nonlinear diodes which are symmetrically placed about the plane of symmetry. All electrical signals have either an "even" or "odd" symmetry relative to the plane of symmetry. If symmetrical about the plane of symmetry, the signal would have an "even" symmetry; this includes the parametrically-induced idler in the unbalanced line. If anti-symmetrical about the plane of symmetry, the signal would have an "odd" symmetry; this includes the large-signal input and the parametrically-induced idler in the balanced line.

A voltage impressed across the terminals 13 and 14, respectively, is considered "odd" since, relative to terminal 17, the terminal 13 and terminal 14 are at equal magnitude but of opposite polarity potentials. A current injected into the terminal 17 from the source in the central branch 18 will divide equally between the pair of diodes 15 and 16 as $i_{21}$ and $i_{23}$, respectively. The voltage at the terminal 13 would have the same magnitude and polarity as the voltage at the terminal 14 when both are referred to the terminal 17. This is considered an "even" symmetry signal.

The input signal at $\omega_s$, where $\omega_s = 2\pi f_s$, is introduced across terminals 13 and 14, where it pumps the pair of diodes 15 and 16 with odd symmetry. It is assumed that the balanced line 52A and 52B can support only odd-mode parametrically-induced idler frequencies and the unbalanced line 53A and 53B can support only even-mode parametrically-induced idler frequencies. The pair of parametrically-induced idlers are so excited that one member has odd symmetry and its mate has even symmetry. The odd symmetry idler, like the pumping signal, propagates down the balanced line, whereas the even symmetry idler propagates down the unbalanced line. The signal at $\omega_s$ will modulate the diodes 15 and 16 in such a way that when diode 15 is driven into a "high" state, diode 16 is simultaneously driven into a "low" state and when diode 15 is driven into a "low" state, diode 16 is simultaneously driven into a "high" state. For the purposes of the following derivation, used for determining the relationships among the large-signal input frequencies and the idler frequencies, it is assumed that each of the two diodes 15 and 16 is replaced by a varistor whose resistance is a linear function of voltage. This is a valid assumption since resistive and reactive mixing are, mathematically, similar processes and the case of the parametrically-induced idler frequency pair can, in the steady state, be thought of as the result of a reactive mixing process. Therefore, when a sinusoidal pump voltage is applied to the assumed varistors, the resulting resistances are given by:

$$R_{12}(t) = R_o[1 - \rho_o \cos(\omega_s t)]$$
$$\text{and}$$
$$R_{23}(t) = R_o[1 + \rho_o \cos(\omega_s t)]$$

Let us assume that an even symmetry, parametrically-induced idler signal in introded at $\omega_2$ in FIG. 4. The voltage appearing across terminals 13 and 14 is given by:

$$v_{12}(t) = R_{12}(t) i_{21}(t)$$
$$= R_o[1 - \rho_o \cos(\omega_s t)][i_o \cos(\omega_2 t)]$$
$$= i_o R_o \left\{ \cos(\omega_2 t) - \frac{\rho_o}{2} [\cos(\omega_s + \omega_2)t + \cos(\omega_s - \omega_2)t] \right\}$$

Neglecting the term at $(\omega_s + \omega_2)$ since it is not pertinent to the discussion of the polarity of the generated idlers, we see a positive voltage component $v_{12}(t)$, across the diode 15 at $\omega_2$ and a negative voltage component at $(\omega_s - \omega_2)$, which, with $\omega_2$, forms the unwanted parametrically-induced idler pair; that is, $$\omega_1 + \omega_2 = \omega_s$$

or $$\omega_1 = \omega_s - \omega_2$$

where $$\omega_1 = 2\pi f_1$$
$$\omega_2 = 2\pi f_2$$

Repeating this calculation for the voltages across terminals 17 and 14, using this time $R_{23}(t)$, then, in this case, the voltage component, $v_{23}(t)$, across the diode 16 at $\omega_2$ is positive and the voltage at $\omega_1$ is also positive.

The two parametric frequency components $\omega_1$ and $\omega_2$ of $v_{12}(t)$ and $v_{23}(t)$ are shown in FIG. 4 where the direction or arrows 58, 59, 60 and 61 indicate the signs of the parametric frequency components for $v_{12}(t)$ and $v_{23}(t)$ respectively. The voltage at $\omega_1$ is odd, as a result of an even voltage at $\omega_2$. The two components of one frequency ($\omega_2$) of the idler pair will have an even symmetry and the two components of its mate ($\omega_1$) will have odd symmetry. In summary, the generated idler frequencies, $\omega_1$ and $\omega_2$, must respectively have odd and even symmetry and, hence, would propagate out of the unbalanced and balanced transmission lines respectively. The previously discussed Manley-Rowe relationships have shown that by suppressing one of the idlers, its mate is also suppressed.

Figure 6:
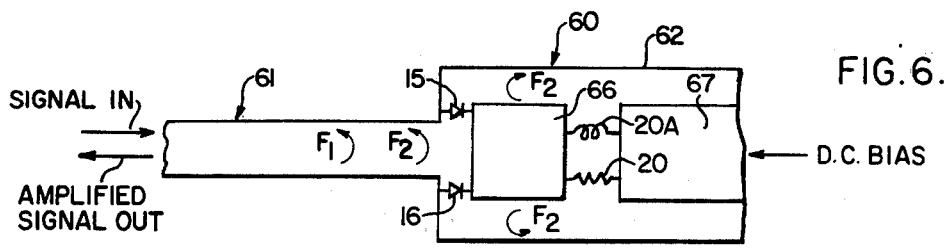
FIG. 6 is a schematic representation of an IMPATT amplifier according to another embodiment of the invention.
Figure 7:
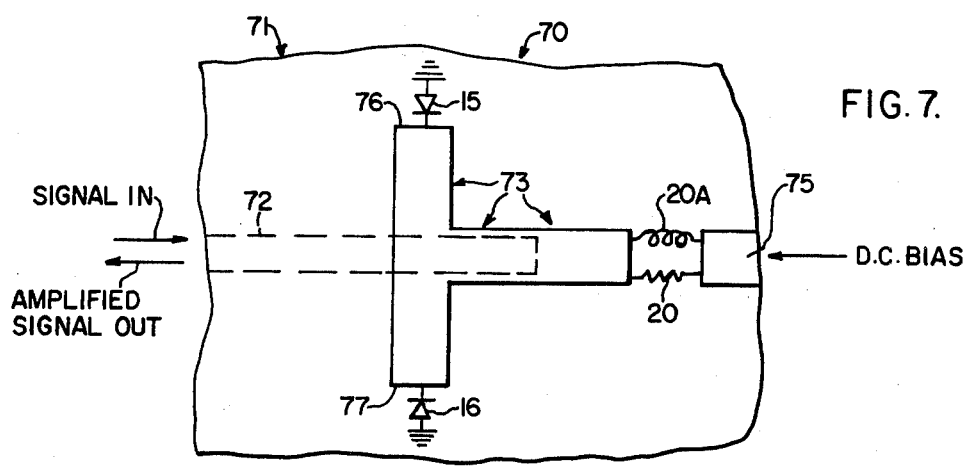
FIG. 7 is a schematic representation of an IMPATT amplifier according to still another embodiment of the invention.

Referring to the embodiment of FIG. 6, an IMPATT amplifier 60 having a slot line portion 61, which is the balanced transmission line and a larger area unbalanced transmission line portion 62, which is a coplanar line, includes the avalanche diodes 15 and 16 commonly connected to central branch portion 66 of the unbalanced line and their anodes connected to the junction of slot line 61 and coplanar line 62 to be connected in anti-series relationship. The inductance 20A is connected in parallel with the resistance 20 between the portion 66 and portion 67 of the central branch and a d-c bias source. Referring to still another embodiment in FIG. 7, an IMPATT amplifier 70 includes a substrate 71 beneath which or on the underside thereof is a slot line represented by the dashed lines 72 to form the balanced transmission line. On the other side of the substrate 71 and overlapping the slot line 72 is a microstrip line 73 to form the unbalanced transmission line portion. Connected to microstrip line 73 are the resistance 20 and the inductance 20A commonly connected to portion 75 to a d-c bias source. The avalanche diodes 15 and 16 are commonly connected at their cathode terminals to the microstrip 73 at 76 and 77 respectively. The anode terminals are connected to ground.

Thus, there is disclosed an improved IMPATT amplifier apparatus which includes at least one pair of diodes in an anti-series arrangement, operating in the avalanche condition, at high frequency, electrically connected to the junction of a balanced and an unbalanced transmission line. The central branch of the unbalanced line, connected to the common terminal of the diodes, is resistively loaded to overcome the unwanted parametrically-induced negative-resistance in the diode circuit and to suppress the unwanted parametrically-induced oscillations from both the unbalanced and balanced transmission lines simultaneously.

It is not necessary in my invention to predict which component of the component-pair will exist in the balanced or unbalanced transmission line because when one component of the pair is suppressed, the other component is simultaneously suppressed. It is necessary that the resistive loading in the unbalanced transmission line be frequency independent.

Figure 5:
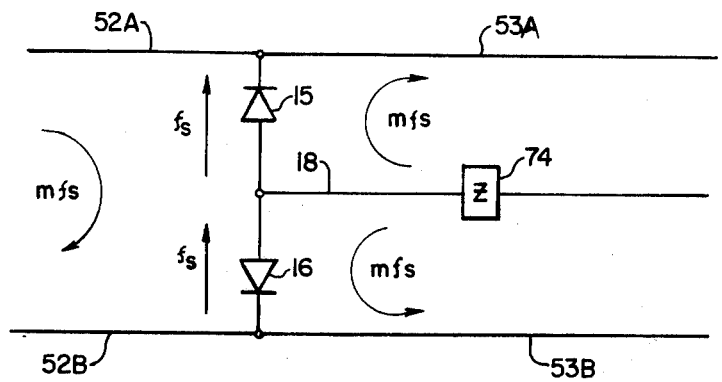
FIG. 5 is a schematic diagram of an anti-series diode pair pumped at $f_s$ and generating $mf_s$ harmonics.

Suppression of the even and hence also the odd symmetry parametric oscillations at frequencies $\omega_2$ and $\omega_1$ respectively eliminates the possibility of generating other unwanted mixing products $mf_s \pm nf_1$ and $mf_s \pm nf_2$. As is well known to those skilled in the art, harmonics of the large-signal $mf_s$ are generated by the action of the large-signal in the nonlinear semiconductor devices. Referring to FIG. 5, the large-signal $f_s$ is pumped in the balanced transmission line 52A and 52B and, by action of the nonlinear diodes 15 and 16, generates all harmonics $mf_s$ where $m = 1, 2, \ldots \infty$. When $m$ is an even integer, the harmonics have an even symmetry and are propagated in the unbalanced line 53A and 53B; the most important is the second harmonic. When $m$ is an odd integer, the harmonics have an odd symmetry and are propagated in the balanced line 52A and 52B. The even harmonics can be reactively terminated in an impedance 74 that maximizes the power output, gain and efficiency of the IMPATT apparatus at the large-signal frequency $f_s$. In accordance with the present invention, the unbalanced line 53A and 53B is available for independent even harmonic tuning without affecting the balanced line 52A and 72B large-signal input circuit.

For the same reason that even harmonics of the signal have even symmetry and propagate in the unbalanced line, if two large-signals, $f_{sa}$ and $f_{sb}$, are impressed simultaneously on the IMPATT amplifier, all intermodulation products, $mf_{sa} \pm nf_{sb}$, for which $m+n$ is an even integer, will be constrained to propagate only in the unbalanced line. Since these even order intermodulation products do not propagate in the balanced line containing the large-signals, $f_{sa}$ and $f_{sb}$, the total number of undesired intermodulation products is halved, i.e., only odd order products are present on the balanced line.

For a more detailed description of IMPATT amplifiers and oscillators generally reference is made to publications entitled "Microwave Semiconductor Devices and Their Circuit Applications" edited by H. A. Watson (1969) and published by McGraw-Hill Co., and "Avalanche Transit-Time Devices", a collection by George I. Haddad of articles in this field and published by Artech House, Inc. (1973).

I claim:

1. A balanced circuit for suppressing parametric oscillations in IMPATT apparatus that includes avalanche devices, comprising:
    a balanced transmission line for propagating a broadband of frequencies including odd harmonics of a large-signal input frequency and a parametrically-generated idler signal having odd symmetry,
    an unbalanced transmission line for propagating a broadband of frequencies including even harmonics of a large-signal input and a parametrically-generated idler signal having even symmetry,
    at least one pair of avalanche devices in an anti-series arrangement electrically connected at the junction of the balanced and the unbalanced transmission lines,
    said unbalanced transmission line having a central branch connected to the anti-series arrangement at its common terminal,
    a constant current d-c power supply in the unbalanced transmission line for biasing the avalanche devices to operate in the avalanche condition,
    a frequency-independent resistive loading in the unbalanced transmission line to overcome negative resistance parametrically generated in the avalanche devices when a large-signal input is impressed across the devices operating in the avalanche condition, to suppress the parametrically-generated idler signal of even symmetry in the unbalanced transmission line and to simultaneously suppress the parametrically-generated idler signal of odd symmetry in the balanced transmission line, and
    an inductance, connected across the resistive loading, having a impedance greater than that of the resistive loading at the lowest anticipated frequency and providing minimum shunting resistance to the d-c bias current.

2. A balanced circuit according to claim 1 wherein said avalanche devices are semiconductor diodes.

3. A balanced circuit according to claim 1 wherein said balanced transmission line is a two-conductor transmission line.

4. A balanced circuit according to claim 1 wherein said balanced transmission line is a waveguide.

5. A balanced circuit according to claim 1 wherein said balanced transmission line is a slot line.

6. A balanced circuit according to claim 1 wherein said unbalanced transmission line is a three-conductor transmission line.

7. A balanced circuit according to claim 1 wherein said unbalanced transmission line is a coaxial line.

8. A balanced circuit according to claim 1 wherein said unbalanced transmission line is a coplanar line.

9. A balanced circuit according to claim 1 wherein said unbalanced transmission line is a microstrip line.

10. A balanced circuit according to claim 1 wherein said unbalanced transmission line is provided with tuning means for independent tuning of the even harmonics of the large-signal input without affecting the balanced transmission line large-signal input circuit.

11. A balanced circuit according to claim 1 wherein said IMPATT apparatus is an IMPATT amplifier.

12. A balanced circuit according to claim 1 wherein even order intermodulation products due to the simultaneous input of more than one large-signal are constrained to the unbalanced line and prevented from flowing in the balanced line.

* * * * *